United States Patent
Prall et al.

[19]

[11] Patent Number: 6,127,236
[45] Date of Patent: Oct. 3, 2000

[54] METHOD OF FORMING A LATERAL BIPOLAR TRANSISTOR

[75] Inventors: Kirk D. Prall; Mike P. Violette, both of Boise, Id.

[73] Assignee: Micron Technology, Inc., Boise, Id.

[21] Appl. No.: 09/131,454

[22] Filed: Aug. 10, 1998

Related U.S. Application Data

[62] Division of application No. 09/026,235, Feb. 19, 1998, Pat. No. 5,965,923, which is a continuation of application No. 08/766,659, Dec. 16, 1996, Pat. No. 5,945,726.

[51] Int. Cl.[7] .................................. H01L 21/331
[52] U.S. Cl. ..................... 438/316; 438/204; 438/338
[58] Field of Search .................. 438/335, 338, 438/339, 204, 316, 372, 373, 374, 375, 236

[56] References Cited

U.S. PATENT DOCUMENTS

| | | | |
|---|---|---|---|
| 4,152,627 | 5/1979 | Priel et al. | 315/227 |
| 4,485,393 | 11/1984 | Kumamaru et al. | 357/52 |
| 4,583,106 | 4/1986 | Anantha et al. | 357/35 |
| 4,956,305 | 9/1990 | Arndt . | |
| 4,987,089 | 1/1991 | Roberts | 437/34 |
| 5,049,966 | 9/1991 | Wald . | |
| 5,218,228 | 6/1993 | Williams et al. | 257/593 |
| 5,326,710 | 7/1994 | Joyce et al. . | |
| 5,358,884 | 10/1994 | Violette | 437/341 |
| 5,498,885 | 3/1996 | Deen et al. | 257/141 |
| 5,574,306 | 11/1996 | Wang et al. | 257/557 |
| 5,605,849 | 2/1997 | Chen et al. . | |
| 5,608,236 | 3/1997 | Arakawa et al. | 257/123 |
| 5,666,001 | 9/1997 | Miwa | 257/592 |
| 5,717,241 | 2/1998 | Malhi et al. | 257/378 |
| 5,824,774 | 10/1998 | Kitajima . | |
| 5,828,124 | 10/1998 | Villa | 257/557 |

FOREIGN PATENT DOCUMENTS

| | | |
|---|---|---|
| 57-73964 | 5/1982 | Japan . |
| 58-50772 | 3/1983 | Japan . |
| 2294063 | 12/1990 | Japan . |

OTHER PUBLICATIONS

Akiyama, N., et al., "CMOS–Compatible Lateral Bipolar Transistor for BiCMOS Technology: Part I—Modeling", *IEEE Trans. on Electron Devices*, 39, 948–951, (Apr. 1992).

(List continued on next page.)

*Primary Examiner*—Tuan H. Nguyen
*Attorney, Agent, or Firm*—Schwegman, Lundberg, Woessner & Kluth, P.A.

[57] ABSTRACT

A substantially concentric lateral bipolar transistor and the method of forming same. A base region is disposed about a periphery of an emitter region, and a collector region is disposed about a periphery of the base region to form the concentric lateral bipolar transistor of the invention. A gate overlies the substrate and at least a portion of the base region. At least one electrical contact is formed connecting the base and the gate, although a plurality of contacts may be formed. A further bipolar transistor is formed according to the following method of the invention. A base region is formed in a substrate and a gate region is formed overlying at least a portion of the base region. Emitter and collector terminals are formed on opposed sides of the base region. The gate is used as a mask during first and second ion implants. During the first ion implant the ions bombard the substrate from a first direction to grade a base/emitter junction, and during the second ion implant ions bombard the substrate from a second direction to grade a base/collector junction. Also a lateral bipolar transistor having a decreased base width as a result of implanting ions after fabrication of collector and emitter regions to enlarge the collector and emitter regions, thereby decreasing the base region and increasing gain.

28 Claims, 8 Drawing Sheets

OTHER PUBLICATIONS

Grove, A., *Physics and Technology of Semiconductor Devices*, John Wiley & Sons, Pubs., New York, 224, (1967).

Hayden, J., et al., "A High–Performance 0.5–$\mu$m BiCMOS Technology for Fast 4Mb SRAM's", *IEEE Trans. on Electron Devices*, 39, 1669–1679, (Jul. 1992).

Tamba, A., et al., "CMOS–Compatible Lateral Bipolar Transistor for BiCMOS Technology: Part II—Experimental Results", *IEEE Trans. on Electron Devices*, 39, 1865–1869, (Aug., 1992).

Verdonckt–Vanderbrok, S., et al., "High Gain Lateral Bipolar Transistor", *Int. Electron Devices Meeting: Technical Digest*, San Francisco, CA, 406–409, (Dec. 1988).

Verdonckt–Vanderbrok, S., et al., "High–Gain Lateral Bipolar Action in a MOSFET Structure", *IEEE Trans. on Electron Devices*, 38, 2487–2496, (Nov. 1991).

Verdonckt–Vanderbrok, S., et al., "High–Gain Lateral p–n–p Bipolar Action in a p–MOSFET Structure", *IEEE Electron Device Lett.*, 13, 312–313, (Jun. 1992).

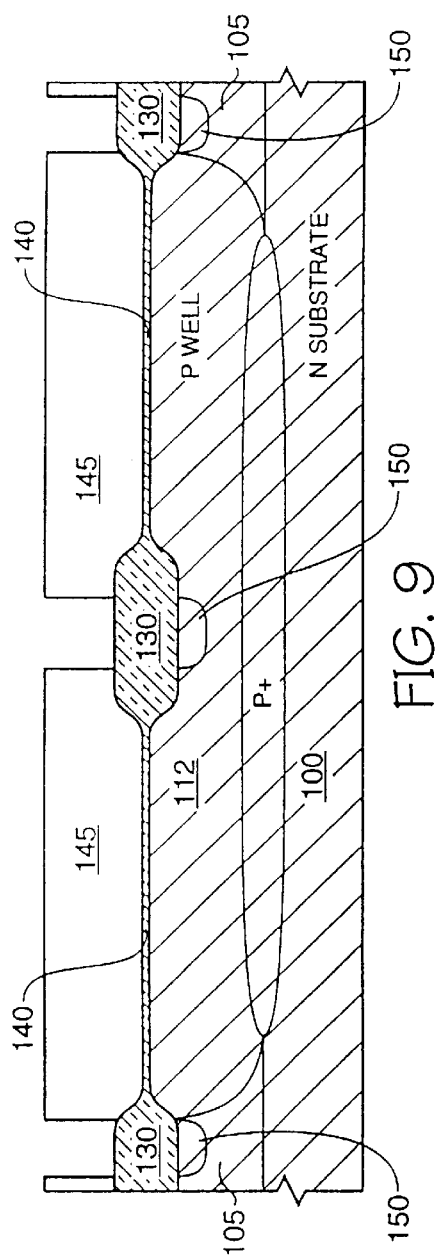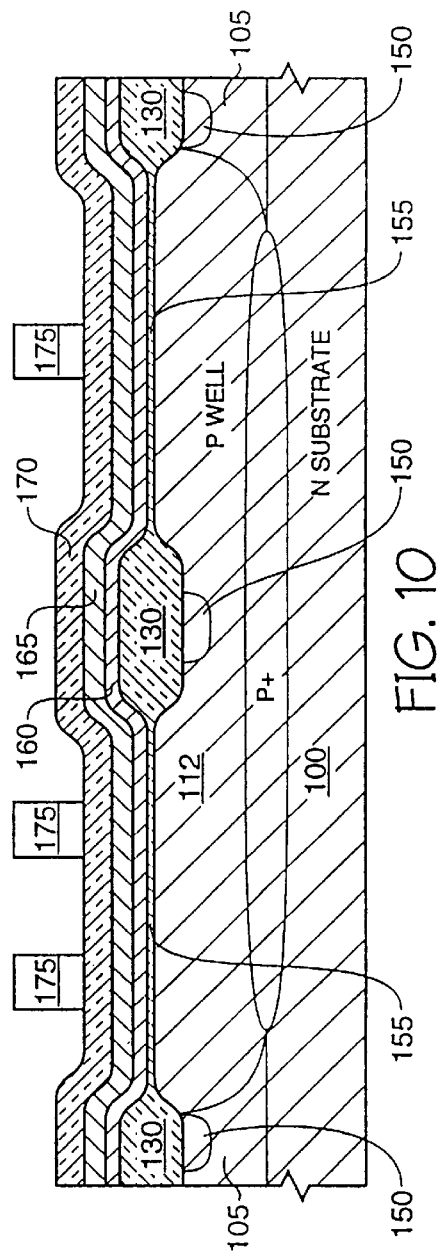

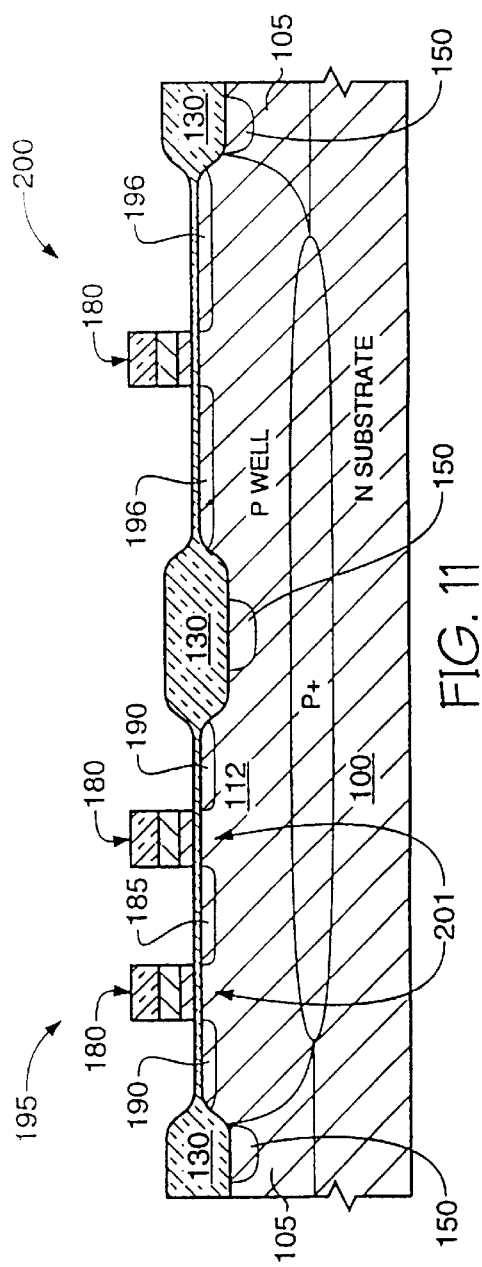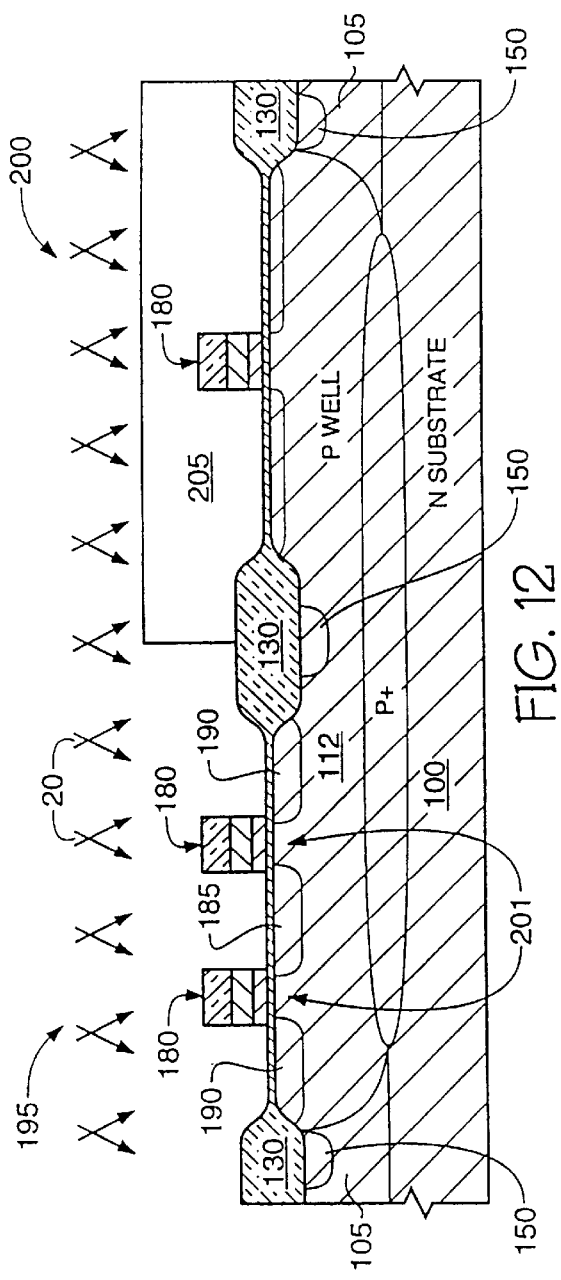

METHOD OF FORMING A LATERAL BIPOLAR TRANSISTOR

This application is a division of U.S. Ser. No. 09/026,235 filed Feb. 19, 1998, now U.S. Pat. No. 5,965,923 which is a continuation of U.S. Ser. No. 08/766,659 field Dec. 16, 1996, now U.S. Pat. No. 5,945,726.

FIELD OF THE INVENTION

The invention relates to semiconductor technology, and in particular to a lateral bipolar transistor and the process for making same.

BACKGROUND OF THE INVENTION

Recently respectable bipolar transistors have been formed using a CMOS (complementary metal-oxide semiconductor) transistor in a typical CMOS process. These bipolar transistors are also referred to as lateral bipolar transistors and are reported to have a threshold frequency (Ft) as high as 3.7 Ghz and a Beta as high as 1000. This alternate method of forming a bipolar transistor has some strong advantages. The process is extremely simple compared to a typical BiCMOS process that uses complicated and expensive process flows costing 30–40% more than a typical CMOS flow. The use of a CMOS flow to create a lateral bipolar transistor adds negligible cost to a current CMOS process and provides a capable bipolar transistor.

The lateral bipolar transistor is fabricated using a typical lightly doped drain (LDD) MOS transistor. An NPN device is formed from an NMOS transistor and a PNP device is formed from a PMOS transistor. The base width of the lateral bipolar transistor is determined by and is usually equal to the MOS channel length. As MOS devices have shrunk the channel lengths have approached the base width of a bipolar making the lateral bipolar transistor possible.

In one variation a base implant is added to the process steps to balance the bipolar and MOS modes of operation. In addition the typical lateral bipolar transistor employs a base-gate contact for providing an electrical connection between the base and gate of the lateral bipolar transistors. Since the base is typically fabricated in the well, the gate depletes the base while the substrate contact controls the base voltage.

The inventors have discovered that the lateral bipolar transistors, fabricated according to the structures described above, have a reduction in gain at high currents or at high bias voltages. Thus, it would be desirable to have a CMOS-based bipolar transistor having improved bipolar performance during high current or high bias voltage conditions.

SUMMARY OF THE INVENTION

One exemplary embodiment of the invention is a substantially concentric lateral bipolar transistor and the method of forming same. The lateral bipolar transistor includes a base region disposed about a periphery of an emitter region and a collector region disposed about a periphery of the base region. A gate overlies the substrate and at least a portion of the base region. At least one electrical contact is formed connecting the base and the gate, although a plurality of contacts may be formed. The invention includes a metal oxide semiconductor inversion region formed in the substrate and a retrograde well formed below the inversion region.

In a further exemplary embodiment a bipolar transistor is formed according to the following method. A base region is formed in a substrate and a gate region is formed overlying at least a portion of the base region. Emitter and collector terminals are formed on opposed sides of the base region. The gate is used as a mask during first and second ion implants. During the first ion implant the ions bombard the substrate from a first direction to grade a base/emitter junction, and during the second ion implant ions bombard the substrate from a second direction to grade a base/collector junction.

In a further exemplary embodiment the invention is a lateral bipolar transistor having a decreased base width. The decreased base region is created by implanting ions after fabrication of collector and emitter regions to enlarge the collector and emitter regions, thereby decreasing the base region and increasing gain.

BRIEF DESCRIPTION OF THE FIGURES

FIGS. 6–13 are cross sectional views of a process for forming the lateral bipolar transistor of the invention.

DETAILED DESCRIPTION OF THE PREFERRED EMBODIMENTS

Figure 1:
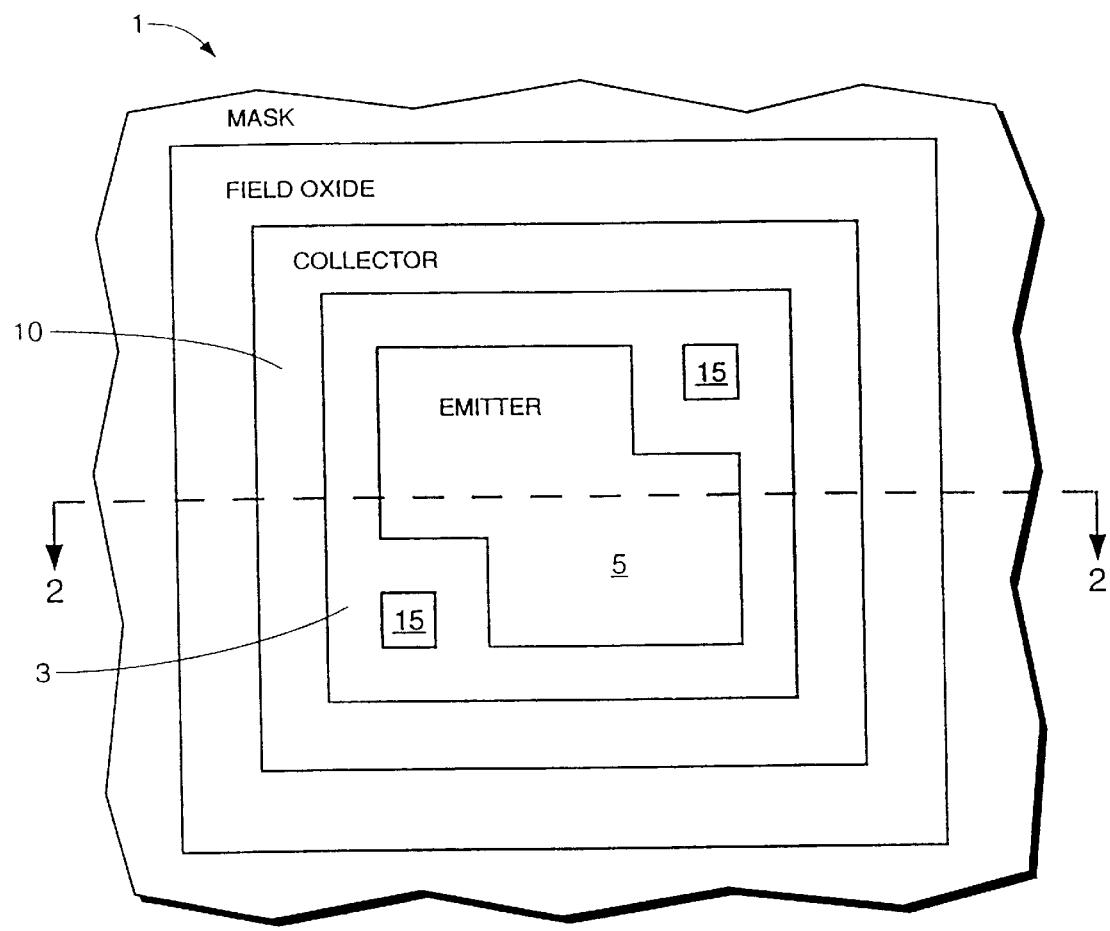
FIG. 1 is a top planar view of a layout of the substantially concentric lateral bipolar transistor of the invention.

One embodiment of the present invention is a concentric lateral bipolar transistor and the method of forming same. The invention includes multiple base-gate contacts. FIG. 1 is a top planar view of a layout of the concentric lateral bipolar transistor 1 of the present invention. This particular layout advantageously reduces the consumption of die area by the lateral bipolar transistor while enhancing performance of the lateral bipolar transistor 1. The base region underlies a poly gate region 3 and is essentially a three dimensional annulus of any shape interposed between an emitter region, 5 and a collector region 10. Thus, the base region is disposed about the emitter region 5 (represented here as a polygonal structure), and the collector region 10 is disposed about the base region. A reduced base resistance and/or reduced stray capacitance of the concentric lateral bipolar transistor 1 improves the Ft. In this configuration all of the emitter current is driven toward the collector thereby increasing collector efficiency. In FIG. 1 two base-gate contacts 15 are used to reduce the base resistance. Even though there are two base-gate contacts 15 the total base contact area is very small thereby contributing to minimum device size. In this particular layout of the bipolar transistor 1, an additional, masked, high energy, high dose, angled implant is used to selectively increase a size of the emitter and collector junctions thereby reducing the base width and providing higher gain and higher Ft.

Figure 2:
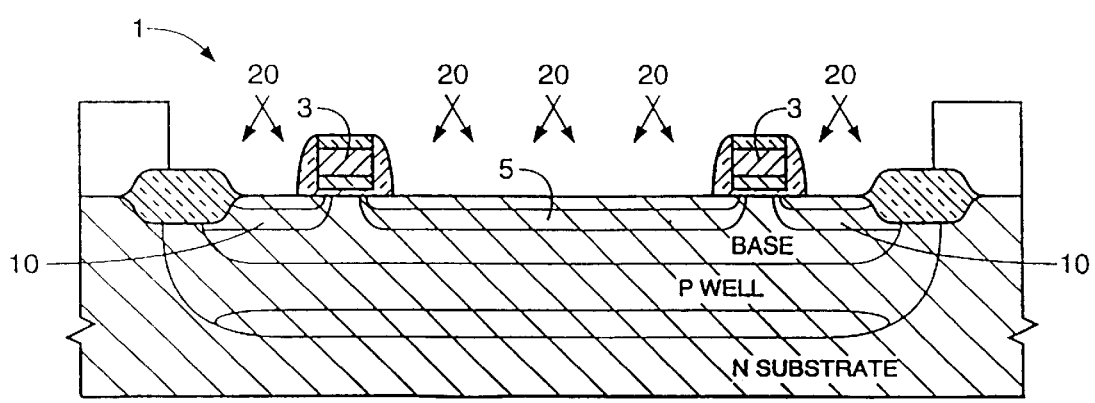
FIG. 2 is a cross sectional view of the transistor in FIG. 1, taken along line 2—2 of FIG. 1, following a high energy, high dose implant.

FIG. 2 is a cross sectional view of the transistor in FIG. 1 following the high energy, high dose implant 20.

Figure 3:
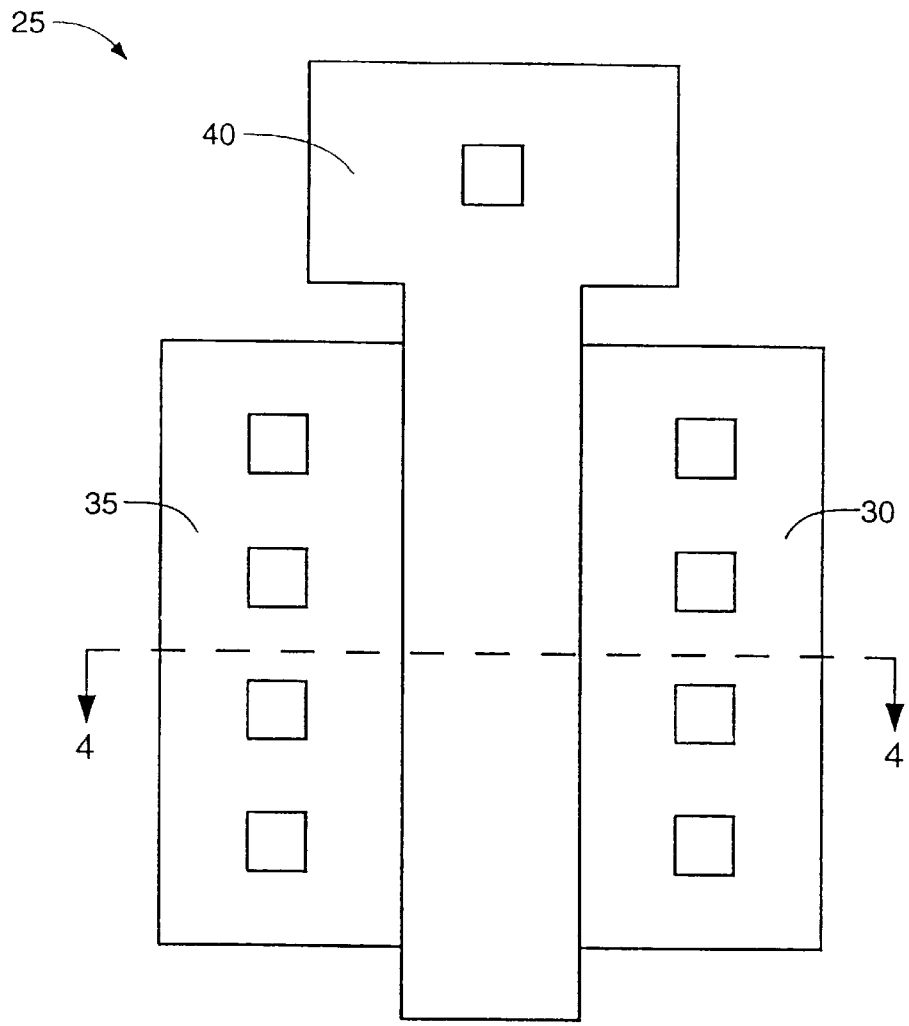
FIG. 3 is a top planar view of a lateral bipolar transistor of a further embodiment of the invention.
Figure 4:
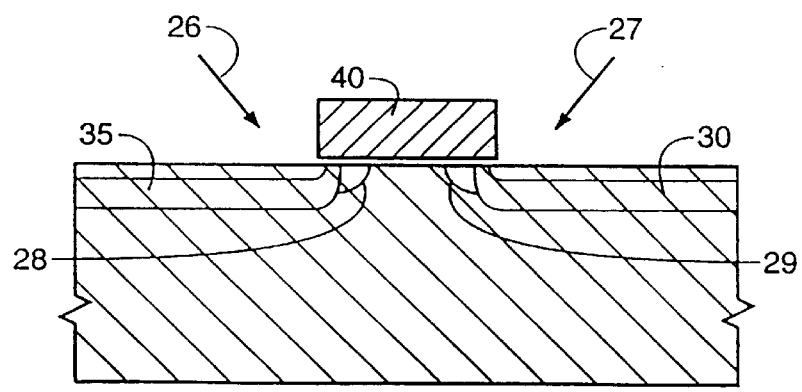
FIG. 4 is a cross sectional view of the bipolar transistor of FIG. 3, taken along line 4—4 of FIG. 3.

FIG. 3 is a top planar view of the lateral bipolar transistor 25 of a further embodiment of the present invention, and FIG. 4 is a cross sectional view of the bipolar transistor 25 of FIG. 3. The lateral bipolar transistor 25 is linear. As shown in FIG. 4, a first angled implant 26 grades the base doping at the base-emitter junction, and a second angled implant 27 grades the base at the base-collector junction. The graded base 28 at the base-emitter junction increases the drift velocity of minority carriers while the graded base 29 at the base-collector junction increases the doping of the collector region 30 which improves the high current operation of the transistor. These two implants use opposite dopant types. Therefore the linear layout is used in order to identically orient the collector region 30 and the emitter region 35 such that only one masking step is required to protect other devices during the angled implant of the lateral bipolar transistor 25. Since only a small number of bipolar devices are needed in most applications, such as sense amplifiers and output drivers, it is possible to orient the emitter region 35 and collector region 30 when using the linear arrangement of the invention in order that the angled implants do not have to be masked separately. Since each of these implants is done at an angle, the poly gate 40 shields the opposite electrode so that the one implant does not affect the other. The high energy, high dose angle implant of-the first embodiment can also be used in this embodiment, without the addition of a further mask, to increase the depths of the emitter region 35 and the collector region 30 and decrease the base width.

In both embodiments described above, the base resistance of the bipolar transistors is firer reduced by adding retrograde wells. In essence, the doping of the wells below the MOS inversion regions is increased to reduce the base resistance without affecting the critical surface doping. Both NPN and PNP bipolar transistors are formed on either N or P type substrates with proper well formation and biasing.

Figure 5:
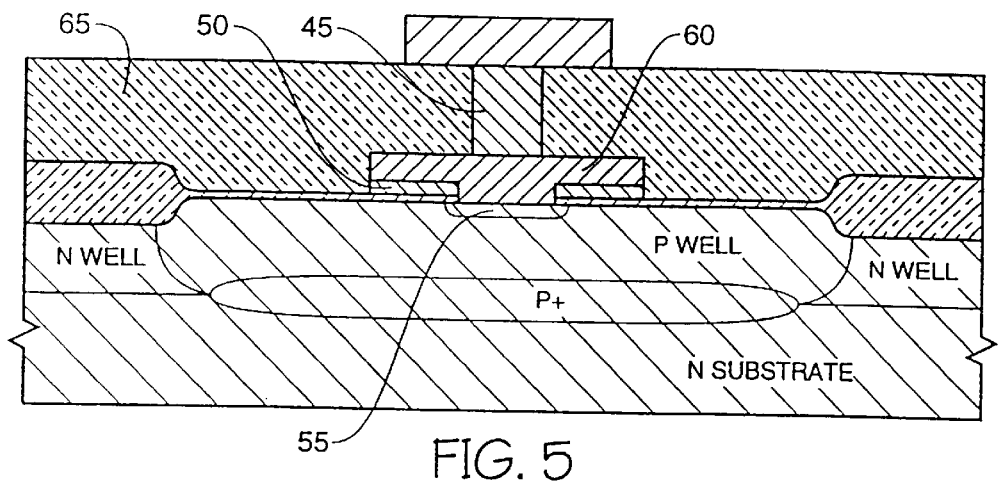
FIG. 5 is a cross sectional view of one type of base-gate contact.

In addition, in both embodiments described above a base-gate contact is formed. In most cases a single buried contact reduces the die area consumed. FIG. 5 illustrates a cross sectional view of an exemplary type of base-gate contact 45 which can be formed according to the present invention. When forming the gate a first poly layer 50 is deposited and etched to expose the base 55 in the contact region. A second poly layer 60 is then deposited to contact the base 55. Both poly layers 50 and 60 are patterned and etched to define the gate region. A thick oxide layer 65 is deposited to overly the poly layers 50 and 60. The oxide 65 is patterned and etched to create an opening exposing the poly layer 60. Tungsten is then formed in the opening. The tungsten forms the base/gate contact 45. Although only one type of base-gate contact is shown in FIG. 5 other types may also be used. In addition a plurality of the base-gate contacts (shown in FIG. 5) may be used in the bipolar transistor of the invention, for example, it may be used to form the base-gate contacts 15 used in the bipolar transistor shown in FIG. 1.

The process for making an NPN lateral bipolar transistor of the invention is shown cross sectionally in FIGS. 6–13. The cross section is representative of the cross section indicated in FIG. 1. The particular process described below is for an N type substrate. It is understood that a similar process is used to form the transistors of the invention with a P type substrate.

Figure 6:
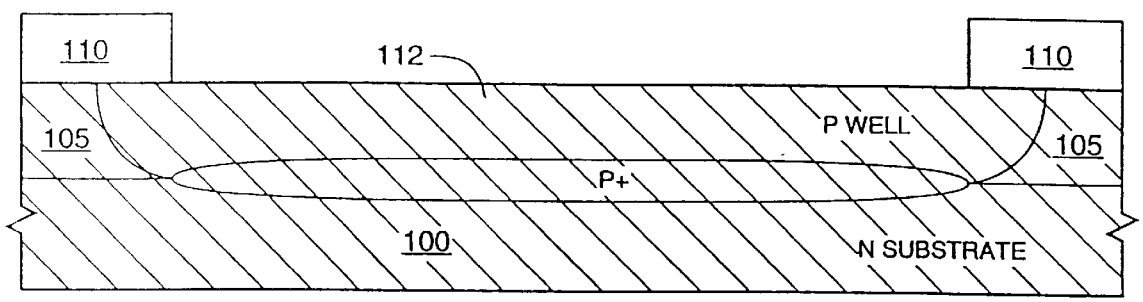

As illustrated in FIG. 6 a light, $2E^{12}$, phosphorus implant preferably in the range of about 50 KeV is performed to adjust a surface concentration of the N-type substrate 100 and to form N-wells 105. A thick oxide 110 is then deposited and photolithography is used to pattern the thick oxide 110 to define a future P-well opening. Boron is implanted in exposed regions preferably at a dose of $7E^{12}$ at 50 KeV and is diffused preferably to a depth of 3 microns. Next a high energy boron implant preferably of $2E^{13}$ at 600 KeV forms a retrograde P-well 112 which reduces the base resistance in the bipolar transistors and improves latch-up immunity. The thick oxide layer is then removed during an etch.

Figure 7:
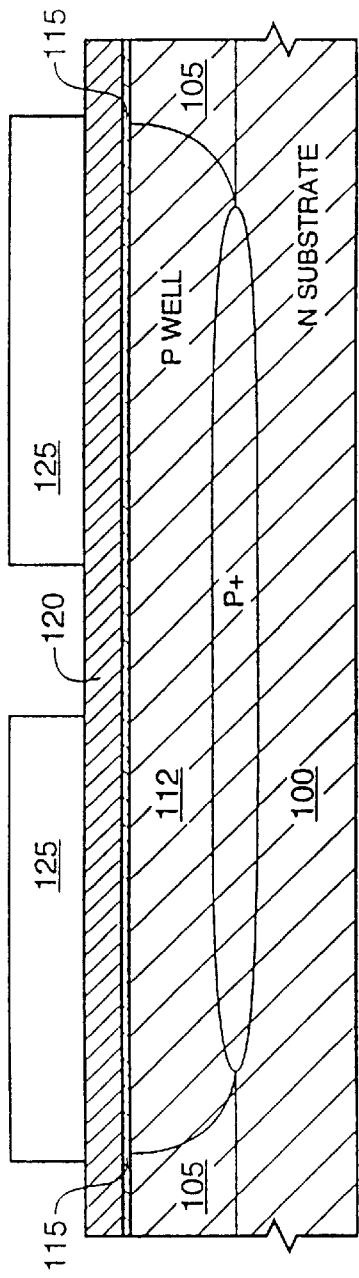

As shown in FIG. 7 an oxide pad 115 (preferably about 200 Angstrom thick) is grown and a nitride layer 120 (preferably about 2000 Angstrom thick) is deposited and patterned with a photoresist mask 125.

Figure 8:
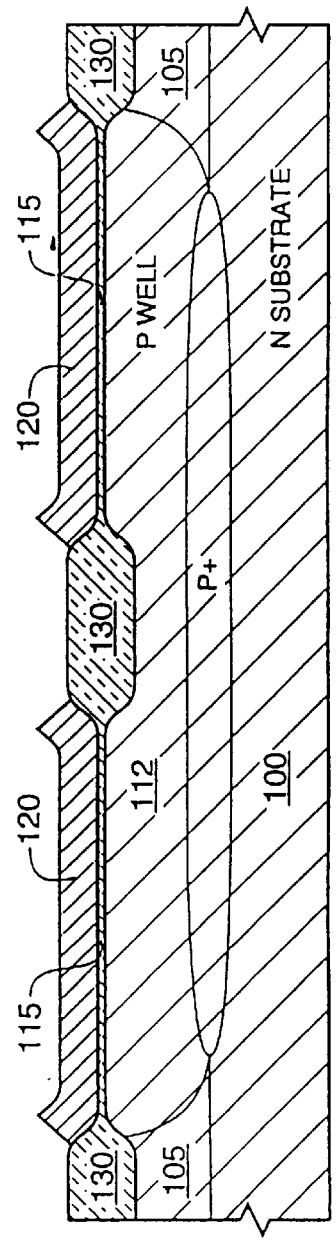

In FIG. 8 the nitride 120 is etched in unmasked regions to expose the substrate. A field oxide region 130 (preferably about 450 Angstrom thick) is then grown on the exposed portion of the substrate. Next the oxide pad 115 and the nitride layer 120 are removed.

FIG. 9 shows a sacrificial oxide layer 140 which is preferentially grown to about a 350 Angstrom thickness. A photoresist mask 145 defines field implant regions. A first boron implant of (preferably) about $3E^{12}$ at about 130 KeV and a second enhancement boron implant of preferably) at about $2E^{12}$ at about 25 KeV are performed to form P type field implant regions 150. The photoresist mask 145 is then removed and the sacrificial oxide 140 is stripped. An optional base implant of (preferably) about $1.0E^{13}$ cm-2 of boron difluoride ions at 20 KeV may also be implanted to guide the electrons away from the surface of the intrinsic base.

As shown in FIG. 10, a gate oxide layer 155 is grown preferably to a thickness of 100 Angstroms. In this first embodiment a first polycrystalline silicon layer 160 having a thickness of 500 Angstroms is deposited and then patterned and etched according to a photoresist mask (not shown) to define contact regions to the substrate. The unmasked first polycrystalline silicon layer 160 and the gate oxide) layer 155 are then etched to expose the substrate in the contact regions which are not shown in this cross section. Next, a second polycrystalline silicon layer 165, preferably of about 1500 Angstroms in thickness, is deposited overlying the first polysilicon layer 160. A Boron implant preferably of about $1E^{15}$ at 25 KeV is performed to dope the polycrystalline silicon layers 160 and 165. This implant is followed by a deposition of an oxide layer 170, preferably having a thickness of about 2500 Angstroms. Finally gates are defined with photoresist mask 175.

The oxide layer 170, the polycrystalline silicon layers 165 and 160, and gate oxide layer 155 of FIG. 10 are etched to form gate regions 180 shown in FIG. 11. A lightly doped drain Arsenic implant, having a preferred dosage of $1E^{12}$ at 100 KeV and an angled Arsenic implant having a preferred dosage of $5E^{12}$ at 100 KeV are performed to form N+ emitter region 185, N+ collector region 190 in the lateral bipolar transistor 195 and to form source/drain regions 196 in the CMOS 200. As shown in FIG. 11 and the top planar view in FIG. 1, the base 201 (underlying the poly gate region of FIG. 1) is concentric with the annular shaped collector 190 (collector 10 of FIG. 1) and lies in between the collector 190 and the emitter 185 (emitter 5 of FIG. 1).

As shown in FIG. 12, the gate regions 180 of the lateral bipolar transistor 195 are used as a pattern during a bipolar implant. Other devices such as CMOS device 200 are masked with photoresist 205 during this step. The bipolar implant deepens and widens the collector region 190 and emitter region 185 thereby decreasing the width of the base 201 in the lateral bipolar transistor 195. The bipolar implant uses a dosage of arsenic atoms preferably ranging between about $5E^4$ and about $1E^{16}$ (most preferably at $5E^{15}$) and at an energy of about 30 to about 200 KeV (most preferably 120 at KeV). The bipolar implant is preferably performed at an angle of 20 degrees from a perpendicular to the substrate, although the angle may range between about 10 and about 40 degrees.

Figure 13:
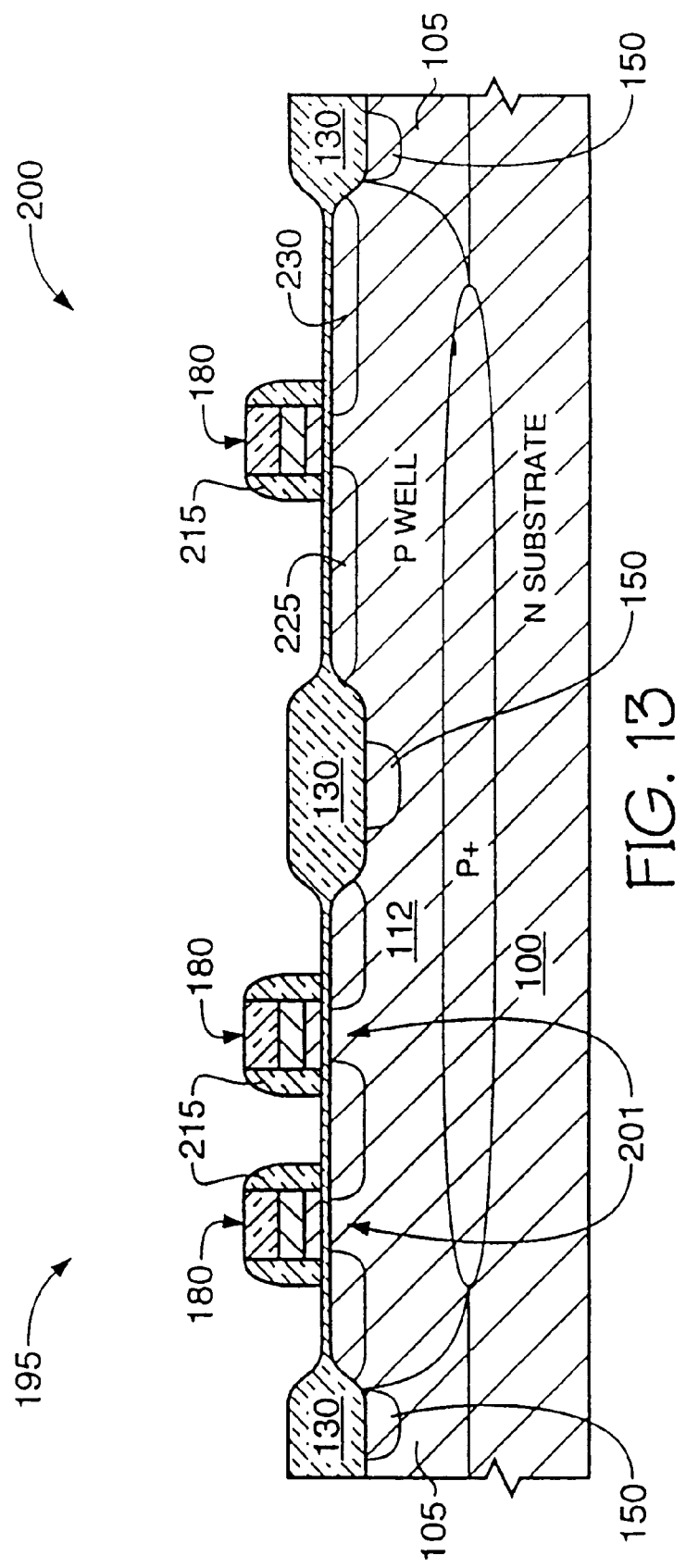

As seen in FIG. 13, the photoresist 205 of FIG. 12 is removed and a conformal oxide layer (not shown) is deposited and then etched to form spacers 215 on the sidewalls of the gate regions 180. Following the spacer 215 formation an Carsenic implant is performed preferably at a dose of 3E15 at 50 KeV at zero degrees thereby patterning N+source 225 and drain 230 regions in the CMOS device 200.

Figure 14:
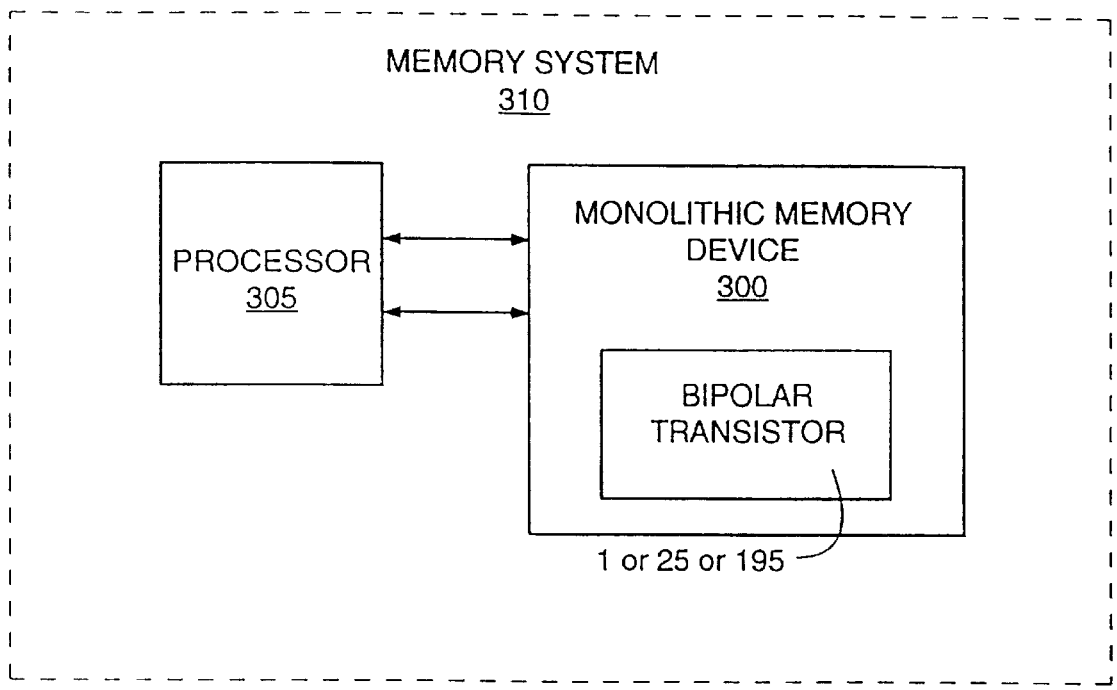
FIG. 14 is a block schematic of a memory system of the invention.

The bipolar transistors 1, 25, and 195 of the invention, shown in FIGS. 1, 3 and 11–13 respectively, of the invention are typically used in a monolithic memory device 300, such as a dynamic random access memory device, as shown in FIG. 14. The monolithic memory device 300 and a processor 305 form part of a memory system 310. The processor 305 is typically-used to generate external control signals which access the monolithic memory device 300 either directly or through a memory controller.

Although exemplary embodiments have been described above the invention should only be limited by the claims.

What is claimed is:

1. A method of forming a lateral bipolar transistor, comprising:
    forming a base region of the bipolar transistor in a substrate having a first type conductivity, the base region having a second type conductivity;
    forming a gate region overlying at least a portion of the base region;
    forming an emitter region and a collector region on opposed sides of the base region, the emitter and the collector regions having the first type conductivity; and
    implanting ions into the substrate at an angle to increase a depth and a width of the emitter region and a depth and width of the collector region, thereby decreasing a width of the base region.

2. The method as specified in claim 1, further comprising implanting the ions at an angle of between 10 and 40 degrees to a perpendicular the substrate.

3. The method as specified in claim 1, further comprising grading a doping of the base region at a base/emitter junction.

4. The method as specified in claim 1, further comprising grading a doping of the base region at a base/collector junction.

5. The method as specified in claim 1, further comprising:
    forming a metal oxide semiconductor inversion region; and
    doping a well underlying the metal oxide semiconductor inversion region.

6. The method of claim 1, wherein the method is performed in the order listed.

7. A method of forming a bipolar transistor, comprising:
    forming a base region of the bipolar transistor in a substrate having a first type conductivity, the base region having a second type conductivity;
    forming a gate region overlying at least a portion of the base region;
    forming a collector region and an emitter region of the bipolar transistor on opposed sides of the base region, the emitter and collector regions having the second type conductivity;
    implanting ions having a first direction into the substrate to grade a base/emitter junction;
    implanting ions having a second direction into the substrate to grade a base/collector junction; and
    masking the substrate with the gate region during implanting ions having the first direction and during implanting ions having the second direction.

8. The method as specified in claim 7, further comprising:
    forming a metal oxide semiconductor inversion region; and
    doping a well underlying the metal oxide semiconductor inversion region.

9. The method as specified in claim 7, further comprising implanting ions into the substrate to increase a depth and a width of the collector region and a depth and a width of the emitter region, thereby decreasing a width of the base region.

10. The method as specified in claim 7, further comprising implanting ions into the substrate to increase a width of the collector region.

11. The method of claim 7, wherein the method is performed in the order listed.

12. A method of forming a bipolar transistor, comprising:
    forming a base region of the bipolar transistor in a substrate having a first type conductivity, the base region having a second type conductivity;
    forming a gate region overlying at least a portion of the base region;
    forming a collector region and an emitter region of the bipolar transistor on opposed sides of the base region, the emitter and collector regions having the second type conductivity;
    implanting ions having a first direction into the substrate to grade a base/emitter junction;
    implanting ions having a second direction into the substrate to grade a base/collector junction; and
    masking the base with the gate region during the step of implanting ions having the first direction and during the step of implanting ions having the second direction.

13. The method of claim 12, wherein the method is performed in the order listed.

14. A method of forming a bipolar transistor, comprising:
    forming an emitter region in a substrate, wherein the substrate has a first type conductivity, further wherein the emitter region has the first type conductivity;
    forming a base region in the substrate, wherein the base region is disposed about a periphery of the emitter region, further wherein the base region has a second type conductivity;
    forming a collector region in the substrate, wherein the collector region is disposed about a periphery of the base region, further wherein the collector region has the first type conductivity;
    forming a gate region overlying at least a portion of the base region;
    expanding the emitter region into the base region by implanting ions at a first angle, thereby decreasing a width of the base region; and
    expanding the collector region into the base region by implanting ions at a second angle, thereby decreasing the width of the base region.

15. The method of claim 14, further comprising:
    forming at least one electrical contact connecting the base region to the gate region.

16. The method of claim 14, further comprising:
    forming a metal oxide semiconductor inversion region underlying the gate region.

17. The method of claim 16, further comprising:
    forming a retrograde well below the inversion region.

18. The method of claim 14, wherein expanding the emitter region comprises implanting ions below the gate region at a base/emitter junction, further wherein expanding the collector region comprises implanting ions below the gate region at a base/collector junction.

19. The method of claim 14, wherein implanting ions at a first angle comprises implanting ions at an angle of between about 10 and 40 degrees to a first side of a perpendicular to the substrate, further wherein implanting ions at a second angle comprises implanting ions at an angle of between about 10 and 40 degrees to a second side of the perpendicular to the substrate, still further wherein the second side of the perpendicular is opposite the first side of the perpendicular.

20. The method of claim 14, wherein forming an emitter region in the substrate occurs subsequent to forming a base region in the substrate.

21. A method of forming a bipolar transistor, comprising:

forming a well in a substrate, wherein the substrate has a first type conductivity and the well has a second type conductivity;

forming a gate region overlying the well, wherein a portion of the well underlying the gate region forms a base region;

forming an emitter region in the well, wherein the emitter region has the first type conductivity, further wherein the base region is disposed about a periphery of the emitter region;

forming a collector region in the well, wherein the collector region has the first type conductivity, further wherein the collector region is disposed about a periphery of the base region;

expanding the emitter region into the base region by implanting ions at a first angle,. thereby decreasing a width of the base region;

expanding the collector region into the base region by implanting ions at a second angle, thereby decreasing the width of the base region; and forming at least one electrical contact connecting the base region to the gate region.

22. A method of forming a bipolar transistor, comprising:

forming a retrograde P-well in an N-substrate;

forming a gate region overlying the P-well, wherein a portion of the P-well underlying the gate region forms a base region;

forming an emitter region in the P-well, wherein the emitter region has an N-type conductivity, further wherein the base region is disposed about a periphery of the emitter region;

forming a collector region in the P-well, wherein the collector region has the N-type conductivity, further wherein the collector region is disposed about a periphery of the base region;

expanding the emitter region into the base region by implanting ions having the N-type conductivity at a first angle, thereby decreasing a width of the base region, expanding the collector region into the base region by implanting ions having the N-type conductivity at a second angle, thereby decreasing the width of the base region, and forming at least one electrical contact connecting the base region to the gate region.

23. A method of forming a bipolar transistor, comprising:

forming a gate region overlying a substrate, wherein the substrate underlying the gate region forms a base region;

forming an emitter region adjacent a first side of the base region, wherein the emitter region has a first dopant type;

forming a collector region adjacent a second side of the base region, wherein the collector region has a second dopant type, further wherein the second dopant type is opposite the first dopant type, still further wherein the second side of the base region is opposed the first side of the base region; and forming at least one electrical contact connecting the base region to the gate region.

24. A method of forming a lateral bipolar transistor, comprising:

forming an emitter region, wherein the emitter region has a first dopant type;

forming a collector region, wherein the collector region has a second dopant type, further wherein the second dopant type is opposite the first dopant type;

forming a base region interposed between the emitter region and the collector region;

forming a gate region overlying at least a portion of the base region; expanding the emitter region into the base region, thereby reducing a width of the base region; and expanding the collector region into the base region, thereby reducing the width of the base region.

25. The method of claim 24, wherein expanding the emitter region comprises implanting dopant ions of the first dopant type below the gate region at a base/emitter junction, further wherein expanding the collector region comprises implanting dopant ions of the second dopant type below the gate region at a base/collector junction.

26. The method of claim 25, wherein expanding the emitter region and expanding the collector region are both performed using one mask.

27. The method of claim 24, wherein expanding the emitter region comprises implanting dopant ions of the first dopant type in the emitter region in a first direction while shielding the collector region from the dopant ions of the first dopant type using the gate region, further wherein expanding the collector region comprises implanting dopant ions of the second dopant type in the collector region in a second direction while shielding the emitter region from the dopant ions of the second dopant type using the gate region.

28. A method of forming a lateral bipolar transistor, comprising:

forming a retrograde well in a substrate;

forming an emitter region in the retrograde well, wherein the emitter region has a first dopant type;

forming a collector region in the retrograde well, wherein the collector region has a second dopant type, further wherein the second dopant type is opposite the first dopant type;

forming a base region in the retrograde well, wherein the base region is interposed between the emitter region and the collector region;

forming a gate region overlying at least a portion of the base region;

expanding the emitter region into the base region, thereby reducing a width of the base region; and expanding the collector region into the base region, thereby reducing the width of the base region.

* * * * *

UNITED STATES PATENT AND TRADEMARK OFFICE
CERTIFICATE OF CORRECTION

PATENT NO.: 6,127,236
DATED: Oct. 3, 2000
INVENTOR(S) : Prall et al.

It is certified that error appears in the above-identified patent and that said Letters Patent is hereby corrected as shown below:

In column 1, line 6, delete "field" and insert --filed--, therefor.

In column 3, line 23, delete "of-the" and insert --of the--, therefor.

In column 3, line 29, delete "firer" and insert --further--, therefor.

In column 4, line 60, delete "5E" and insert --$5E^{14}$--, therefor.

In column 5, line 3, delete "Carsenic" and insert --arsenic--, therefor.

In column 7, line 27, delete "." after "angle,".

In column 7, line 52, delete "," and insert --;--, therefor.

In column 7, line 56, delete "," and insert --;--, therefor.

In columnn 8, line 22, insert a paragraph break after "region;".

Signed and Sealed this

Eighth Day of May, 2001

*Attest:*

NICHOLAS P. GODICI

*Attesting Officer*   Acting Director of the United States Patent and Trademark Office